(12) United States Patent
Tatsuhara et al.

(10) Patent No.: US 7,763,884 B2
(45) Date of Patent: Jul. 27, 2010

(54) ORGANIC SEMICONDUCTOR MATERIAL AND SEMICONDUCTOR DEVICE

(75) Inventors: Mao Tatsuhara, Kanagawa (JP); Akito Ugawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 115 days.

(21) Appl. No.: 11/769,381

(22) Filed: Jun. 27, 2007

(65) Prior Publication Data

US 2008/0119009 A1    May 22, 2008

(30) Foreign Application Priority Data

Jun. 30, 2006    (JP)    ............... 2006-180688

(51) Int. Cl.
*H01L 29/786* (2006.01)
(52) U.S. Cl. .................. 257/40; 257/60; 257/E51.005; 257/E51.001; 257/E51.024; 549/35; 549/36; 549/59; 548/134; 548/135
(58) Field of Classification Search ........................ None
See application file for complete search history.

(56) References Cited

U.S. PATENT DOCUMENTS 6,963,080 B2 * 11/2005 Afzali-Ardakani et al. .... 257/40

FOREIGN PATENT DOCUMENTS

| JP | 05-110069 | 4/1993 |
|---|---|---|
| JP | 2004-064059 | 2/2004 |
| JP | 2006-005036 | 1/2006 |

OTHER PUBLICATIONS

Tomura et al. Synthetic Metals 86 (1997) 1871-1872.*
Yamashita et al. Journal of Materials Chemistry, 1998, 8(9), 1933-1944.*
Aoyagi et al. (Science and Technology of Advanced Materials, 5 (2004), 443-447).*
Dimitrakopoulos et al. Advanced Materials, 2002, 14, 99-117.*
Jun-Ichi Yamada et al.; Synthesis of Unsymmetrical Tetrathiafulvalene Derivatives via Me3Al-Promoted Reactions of Ortanotin Compounds with Esters; The Journal of Organic Chemistry; vol. 61; Jun. 14, 1996; No. 12.
Japanese Office Action issued on Dec. 16, 2008 corresponding to JP Appl. No. 2006-180688.

* cited by examiner

*Primary Examiner*—David Wu
*Assistant Examiner*—Vu Nguyen
(74) *Attorney, Agent, or Firm*—Sonnenschein Nath & Rosenthal LLP

(57) ABSTRACT

An organic semiconductor material represented by the following general formula (1):

$$\underset{S}{\overset{N}{\underset{N}{\bigtriangleup}}}\underset{X4}{\overset{X1}{\bigtriangleup}}=\underset{X3}{\overset{X2}{\bigtriangleup}}\underset{R2}{\overset{R1}{}}\quad(1)$$

wherein $X_1$ to $X_4$ each independently represent a chalcogen atom; and at least one of $R_1$ and $R_2$ represents a substituent for obtaining solubility, and $R_1$ and $R_2$ may be connected to each other to form a ring.

5 Claims, 4 Drawing Sheets

3: STRUCTURAL FORMULA (3)'

2: STRUCTURAL FORMULA (2)

1: STRUCTURAL FORMULA (1)

ORGANIC SEMICONDUCTOR MATERIAL AND SEMICONDUCTOR DEVICE

CROSS REFERENCES TO RELATED APPLICATIONS

The present invention contains subjects related to Japanese Patent Application JP 2006-180688 filed in the Japan Patent Office on Jun. 30, 2006, the entire contents of which being incorporated herein by reference.

BACKGROUND OF THE INVENTION

1. Field of the Invention

The invention relates to an organic semiconductor material and to a semiconductor device and in particular, to an organic semiconductor material made of a derivative of a tetrathiafulvalene based compound and to a semiconductor device using this material.

2. Description of the Related Art

In recent years, studies regarding a semiconductor device using an organic semiconductor material are keenly made, and its performance is within an inch of a practically useful level. At present, it is reported that a fused aromatic compound which is called pentacene exhibits the best performance as a channel material used in this semiconductor device.

Also, hexathiopentacene which is one of pentacene derivatives is shown as a material exhibiting a high carrier mobility; and bis(methylenedithio)tetrathiafulvalene (BMDT-TTF) and TTF derivatives having an alkyl group introduced thereinto are disclosed as other configurations (see JP-A-2006-5036 (Patent Document 1)).

SUMMARY OF THE INVENTION

However, since the foregoing hexathiopentacene is insoluble in a solvent, it cannot be subjected to fabrication or patterning using a coating process such as spin coating and inkjetting. For that reason, a process for sublimating pentacene under high vacuum and vapor depositing it on a substrate is necessary, resulting in causing an increase in a size of manufacturing apparatus and an increase in the manufacturing costs.

On the other hand, though the BMDT-TTF derivatives having an alkyl group introduced thereinto have solubility in a solvent, there is involved a defect that they are instable in the atmosphere in the presence of light so that they are easily oxidized. When the TTF derivative is considered as a practically useful device material, this causes not only a reduction of a yield in the process but also a reduction of reliability due to deterioration in characteristics of a semiconductor device prepared by using the TTF derivative.

Then, it is desirable to provide an organic semiconductor material which while being soluble, is structurally stable and to provide a semiconductor device which is able to be manufactured by a simple and easy method and which is good in characteristics and high in reliability by using this semiconductor material.

According to an embodiment of the invention, there is provided an organic semiconductor material represented by the following general formula (1).

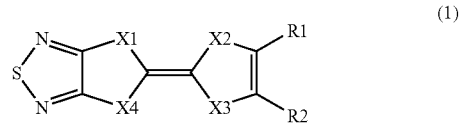

In the foregoing general formula (1), X1 to X4 each independently represent a chalcogen atom. Also, at least one of R1 and R2 represents a substituent for obtaining solubility, and R1 and R2 may be connected to each other to form a ring.

Also, according to an embodiment of the invention, there is provided a semiconductor device configured by using such a semiconductor material.

Since in such a semiconductor material, a tetrathiafulvalene based skeleton configuring a segment as a main skeleton thereof is a strong electron donor, its carrier mobility is high, and a semiconductor thin film configured by using such an organic semiconductor material exhibits good characteristics. Also, by fusing a thiadiazole ring having large electron withdrawing properties on a tetrathiafulvalene based skeleton, the stability against the atmosphere is largely improved. Moreover, by introducing a substituent bearing solubility together, the solubility in an organic solvent is improved, and therefore, the fabrication of a semi-conductor thin film by a coating method becomes possible.

Accordingly, by using an organic semiconductor material which while being soluble, is stable against the atmosphere according to an embodiment of the invention, it is possible to obtain a semiconductor device which is able to be manufactured by a simple and easy method applying a coating process and which is good in characteristics and high in reliability.

DETAILED DESCRIPTION OF THE PREFERRED EMBODIMENTS

Figure 1:
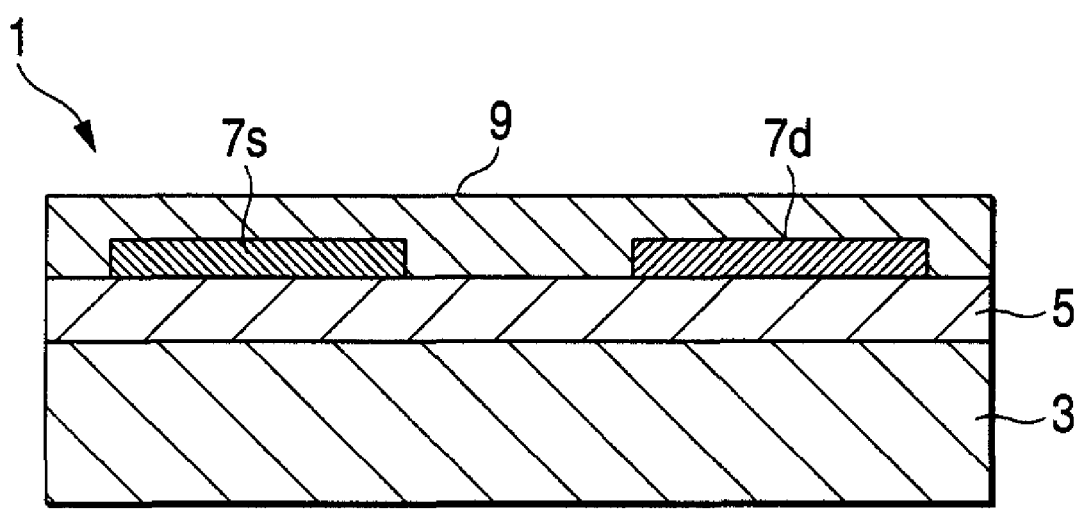
FIG. 1 is a cross-sectional view to show one configuration example in which a semiconductor device according to an embodiment of the invention is applied to an organic thin film transistor of a field effect type.

Embodiments of the invention are hereunder explained in the order of an organic semiconductor material, its synthesis method and a semiconductor device using this organic semiconductor material.

<Organic Semiconductor Material>

More specific constitutions of an organic semiconductor material represented by the foregoing general formula (1) are given in the following general formulae (2) to (7). Incidentally, in theses general formulae (2) to (7), tetrathiafulvalene ($C_6H_4S_4$: TTF) derivatives in which the chalcogen atom represented by each of X1 to X4 in the general formula (1) is sulfur (S) are shown.

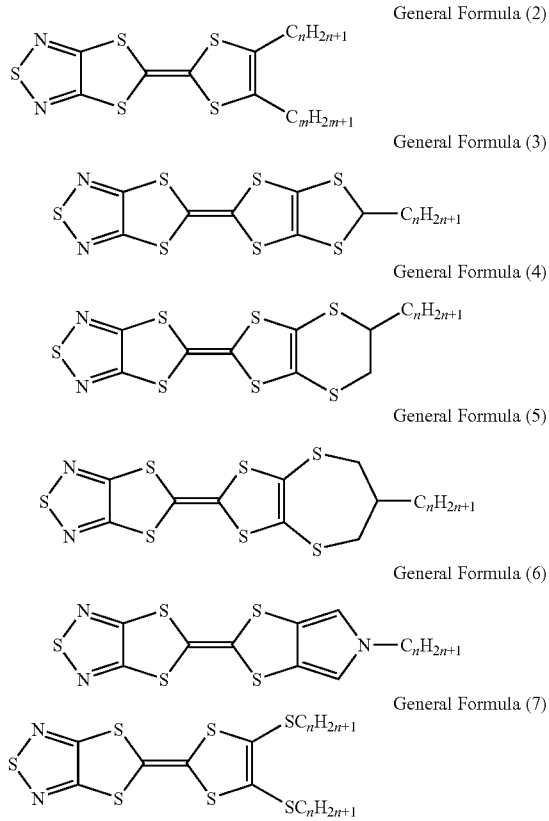

The organic semiconductor materials represented by these general formulae (2) to (7) have a structure in which not only a thiadiazole ring is fused at the 2- and 3-positions of the TTF skeleton, but also a substituent for obtaining solubility is modified at least one of the 6- and 7-positions of the TTF skeleton. In these general formulae (2) to (7), n represents an integer of 1 or more. Also, in the general formula (2), m represents an integer of 0 or more. Also, these n and m are each an integer such that the TTF derivative as the present organic semiconductor material becomes soluble in a solvent.

In the foregoing general formula (2), an alkyl group is modified as a substituent capable of bringing solubility at at least one of the 6- and 7-positions of the TTF skeleton. Also, the hydrogen at either one of the 6- and 7-positions at which the alkyl group is not modified may be substituted with a halogen.

In the foregoing general formula (3), an alkylmethylenedithio group is modified as a substituent capable of bringing solubility at the 6- and 7-positions of the TTF skeleton. Similarly, in the general formula (4), an alkylethylenedithio group is modified; in the general formula (5), an alkylpropylenedithio group is modified; in the general formula (6), an alkylpyrrole group is modified; and in the general formula (7), a thioalkyl group is modified.

Also, the terminal alkyl group moiety represented by each of the foregoing general formulae (2) to (7) may be linear or branched. Also, the hydrogen in such an alkyl group may be further substituted with a halogen.

In particular, in each of the general formulae (3) to (5), in the substituent capable of bringing solubility and introduced at the 6- and 7-positions of the TFT skeleton, two alkyl groups may be introduced at the same substitution position, and compounds of such a configuration are enumerated as the organic semiconductor material according to an embodiment of the invention. In that case, the two alkyl groups introduced at the same substitution position may have a different carbon atom number from each other.

In the organic semiconductor material made of the foregoing TTF derivative according to an embodiment of the invention, since TTF as a main skeleton is a strong electron donor, its carrier mobility is high, and a semiconductor thin film configured by using such an organic semiconductor material exhibits good characteristics. Also, by fusing a thiadiazole ring having large electron withdrawing properties, the stability of TTF against the atmosphere is largely improved, and a material which is hardly oxidized is brought. Thus, it is possible to obtain an organic semiconductor device having good characteristics and high reliability.

Moreover, by having an alkyl group in an end terminal, the organic semiconductor material has a configuration in which a substituent bearing solubility is introduced together, and its solubility in an organic solvent is improved. Thus, it becomes possible to achieve fabrication of a semiconductor thin film by a coating method.

As a result, by using the organic semiconductor material which while being soluble, has stability against the atmosphere according to an embodiment of the invention, it is possible to obtain a semiconductor device which is able to be manufactured by a simple and easy method applying a coating process and which is good in characteristics and high in reliability.

Incidentally, with respect to the foregoing general formulae (2) to (7), the organic semiconductor materials using sulfur (S) as the chalcogen atom have been enumerated. However, it is enough that the organic semiconductor material according to an embodiment of the invention has a structure in which a thiadiazole ring is fused at the 2- and 3-positions of a so-called TTF based skeleton wherein in the foregoing general formula (1), each of X1 to X4 independently represents a chalcogen atom such as oxygen (O), sulfur (S), selenium (Se), and tellurium (Te) and a substituent for obtaining solubility is modified at least one of the 6- and 7-positions of the TTF based skeleton.

Examples of such compounds include TSeF($C_6H_4Se_4$) derivatives wherein in the general formula (1), X1 to X4 are each selenium (Se) and TTeF ($C_6H_4Te_4$) derivatives wherein in the general formula (1), X1 to X4 are each tellurium (Te). Specific examples of these derivatives include configurations resulting from substituting the four sulfurs (S) in the TTF skeleton in each of the general formulae (2) to (7) with selenium (Se) or tellurium (Te).

Also, in addition to the above, X1 to X4 may be further a different chalcogen atom; and furthermore, X1 to X4 may be a chalcogen atom different from each other.

Such compounds are all a derivative of a TTF based compound represented by the general formula (1), and the same effects can be obtained.

<Synthesis Method of Organic Semiconductor Material>

A synthesis method of the organic semiconductor material made of a derivative of a TTF based compound having the foregoing configuration according to an embodiment of the invention is illustrated in the following synthesis scheme (1).

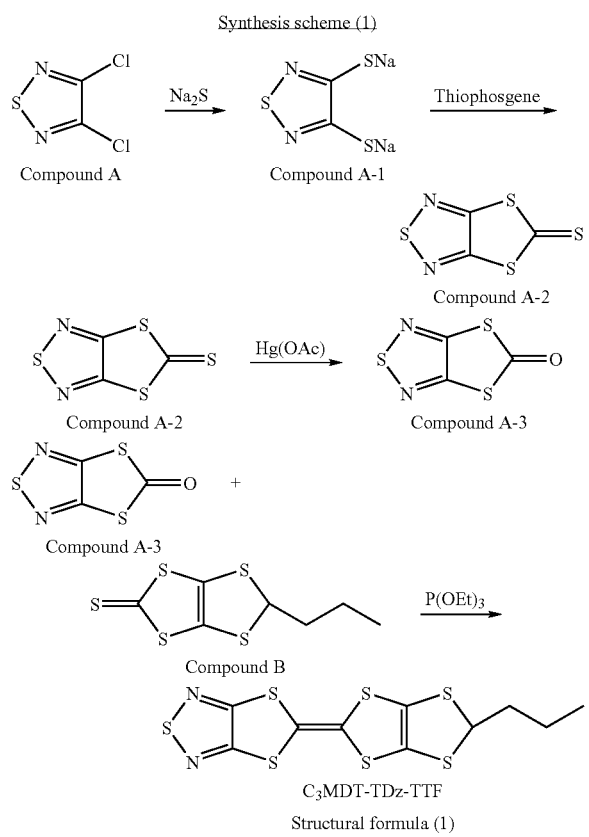

Synthesis scheme (1)

As illustrated in the synthesis scheme (1), in the synthesis of a derivative of a TTF based compound, a compound A-3 is first synthesized via a compound A-1 and a compound A-2 by using a compound A as a starting material. This compound A-3 is subjected to condensation reaction with a compound B in which a substituent capable of bringing solubility is modified. A final reaction product is produced by using a silica gel column, thereby obtaining an organic semiconductor material having a structure (C$_3$MDT-TDz-TTF) represented by the structural formula (1) as a targeted material in a yield of approximately 50%. Incidentally, in the structural formula (1), the alkyl group [C$_n$H$_{2n+1}$] in the TTF derivative represented by the foregoing general formula (3) is a propyl group.

Also, in the case of synthesizing other TTF derivatives represented by the general formulae (2) to (7), the compound B as illustrated in the foregoing synthesis scheme (1) may be substituted with a compound (thione) B in which the respective substituent capable of bringing solubility is modified.

<Semiconductor Device>

FIG. 1 is a cross-sectional view to show one example of a semiconductor device using the foregoing organic semiconductor material. The semiconductor device as illustrated in this drawing is an organic thin film transistor 1 of a field effect type, and a gate dielectric film 5 is fabricated on a gate electrode 3 made of p$^+$ polysilicon. A source 7$s$ and a drain 7$d$ are pattern formed on this gate dielectric film 5, and a semiconductor thin film 9 made of the foregoing organic semiconductor material is provided as a channel layer between the source 7$s$ and the drain 7$d$.

In manufacturing such a semiconductor device (organic thin film transistor) 1, the semiconductor thin film 9 can be formed by vapor deposition fabrication. Besides, since the foregoing organic semiconductor material which is soluble in a solvent is used, coating fabrication can be applied.

In the case of performing coating fabrication, a coating solution of the foregoing organic semiconductor material dissolved in a solvent is prepared. General organic solvents are useful as the solvent, and, for example, methyl-substituted benzenes such as toluene and xylene, chlorine-substituted benzenes such as dichlorobenzene, chloroform, tetralin, and decalin are useful. By using it, the semiconductor thin film 9 made of an organic semiconductor material can be pattern formed entirely or partially by a coating process such as a spin coating method, an inkjet method, and a printing method.

Thus, it has become possible to form the semiconductor thin film 9 made of an organic semiconductor material by simple and easy coating fabrication as compared with vapor deposition fabrication. In this way, it is possible to design to reduce the manufacturing costs of the semiconductor device 1 provided with this semiconductor thin film 9. It is also possible to form the semiconductor thin film 9 on a substrate having a large area by the foregoing coating fabrication simply and easily at a low cost. Thus, for example, even in manufacturing a display device of a large area provided with a thin film transistor array in a display region, it is possible to simplify the steps and to design to reduce the costs.

Also, since the foregoing organic semiconductor material according to an embodiment of the invention is good in stability in the atmosphere, deterioration of the organic thin film transistor 1 using this organic semiconductor material is suppressed, and it is possible to design to improve the maintenance of device characteristics and reliability. Furthermore, since the organic semiconductor material according to an embodiment of the invention is a material with high carrier mobility, the semiconductor thin film 9 configured by using this organic semiconductor material exhibits good characteristics.

Also, as shown in the following Example, it has been noted that by fusing a thiadiazole ring on a so-called TTF based skeleton, a high value in an ON/OFF ratio of current value in a state that a voltage is applied (ON) or not applied (OFF) is obtained with respect to a semiconductor thin film using this organic semiconductor material. In this way, it is possible to design to improve a channel performance in a semiconductor device using this organic semiconductor material as a channel layer.

Incidentally, the organic thin film transistor 1 of a field effect type which is provided with the semiconductor thin film (channel layer) 9 made of the organic semiconductor material according to an embodiment of the invention is not limited to a bottom gate/bottom contact type as illustrated in FIG. 1. Other examples thereof include a bottom gate/top contact type, a top gate/bottom contact type, and a top gate/top contact type. In these organic thin film transistors, the semiconductor thin film 9 configuring each channel layer can be formed by coating fabrication.

Also, the semiconductor device using the organic semiconductor material according to an embodiment of the invention is not limited to the organic thin film transistor of a field effect type but is widely applicable to semiconductor devices configured by using an organic semiconductor material. In particular, of semiconductor devices provided with a semiconductor thin film made of an organic semiconductor material, the semiconductor device using the organic semiconductor material according to an embodiment of the invention is preferably applied to a semiconductor device having a configuration in which a carrier is moved in a direction along the thin film surface in a semiconductor thin film, and the same effects as in the present embodiment can be obtained.

EXAMPLE

1) Calculation of Ionization Potential:

For the purpose of confirming the stability of the organic semiconductor material according to an embodiment of the invention in the atmosphere, an ionization potential (IP) expressing oxidation resistance was calculated as shown in the following Table 1. The calculation of the ionization potential (IP) was carried out according to the density functional theory (B3LYP) of Gaussian 03, and 6-31G(d,p) was used as a basis set.

3) Device Characteristic-1:

For the purpose of confirming a carrier mobility of the organic semiconductor material according to an embodiment of the invention, an organic thin film transistor using, as a channel layer, a semiconductor thin film made of the TTF derivative ($C_3$MDT-TDz-TTF) represented by the foregoing structural formula (1) (see FIG. 1) was prepared, and a gate voltage (Vg) -drain current (Ig) characteristic was measured. Also, as comparative examples, the same measurement was performed with respect to organic thin film transistors using a TTF derivative represented by each of the structural formula (2) and structural formula (3)' [structure in which a propyl

TABLE 1

| | MDT-TDz-TTF | MDT-DCM-TTF | BMDT-TTF |
|---|---|---|---|
| Structure | Structural formula (1)' | Structural formula (2) | Structural formula (3) |
| IP (eV) | 7.28 | 6.44 | 6.08 |

Incidentally, since the alkyl group does not contribute to the oxidation resistance, the ionization potential was calculated with respect to the structural formula (1)' wherein an alkyl group [$C_nH_{2n+1}$] as a substituent capable of bringing solubility is not introduced in the structural formula (1). Also, as comparative examples, the results obtained by calculating the ionization potential with respect to TTF derivatives represented by the structural formulae (2) and (3) in which a thiadiazole ring is not fused are also shown.

As is clear from the foregoing Table 1, the ionization potential (IP) of the TTF derivative in which a thiadiazole ring is fused [structural formula (1)'] exhibited a larger value than the ionization potentials (IP) of other TTF derivatives [structural formulae (2) and (3)]. It has been confirmed from this that the organic semiconductor material in which a thiadiazole ring is fused on a TTF based skeleton according to an embodiment of the invention is high in oxidation resistance and good in stability in the atmosphere.

Figure 2:
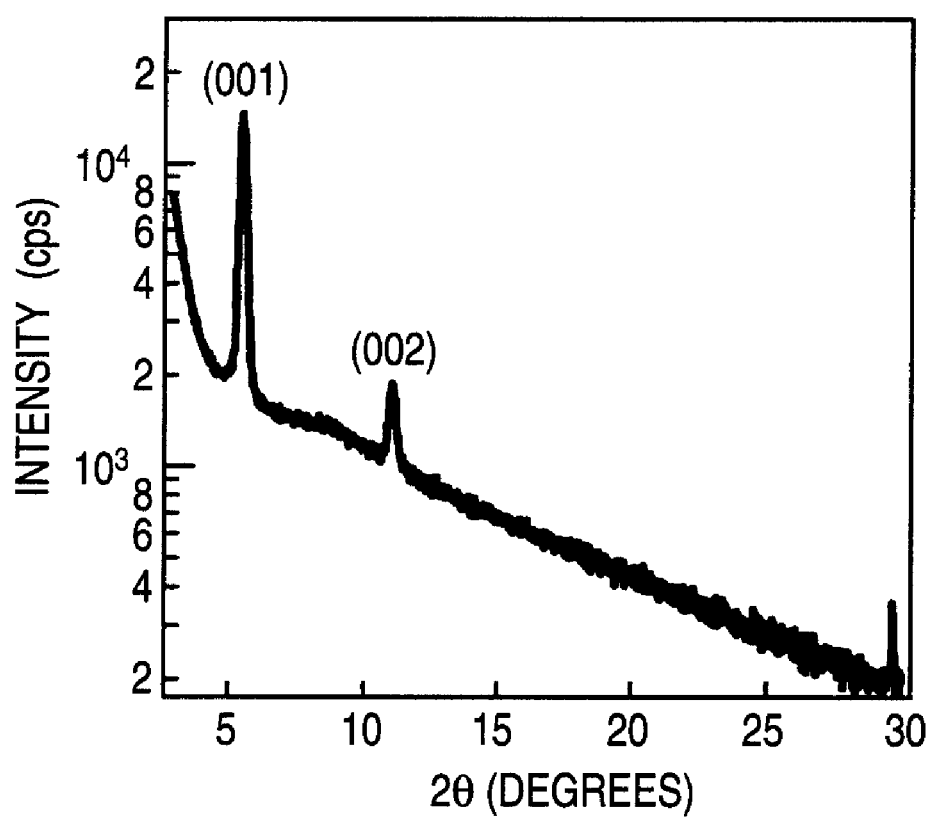
FIG. 2 is a graph to show measurement results of XRD of a semiconductor thin film fabricated by a spin coating method by using a chloroform solution of a TTF derivative ($C_3$MDT-TDz-TTF) of a structural formula (1) according to an embodiment of the invention.

2) Physical Properties of Thin Film:

For the purpose of confirming solubility of the organic semiconductor material according to an embodiment of the invention, a semiconductor thin film was fabricated by using a chloroform solution of the TTF derivative ($C_3$MDT-TDz-TTF) represented by the foregoing structural formula (1) by a spin coating method, and XRD regarding this semiconductor thin film was measured. The obtained results are shown in FIG. 2. As shown in FIG. 2, a sharp diffraction peak corresponding to a spacing (001) of 15.88 angstroms was observed (X-ray wavelength $\lambda$=1.54 angstroms). It has been confirmed from this that as a result of the fact that the organic semiconductor material according to an embodiment of the invention has high solubility, a thin film with high orientation properties is formed by a coating process using a solution. Incidentally, it is revealed that the spacing (001) obtained by this XRD measurement is substantially equal to a length of the molecule in a long axis direction thereof and that the long axis of the molecule is oriented vertical against the substrate.

group is introduced in the structural formula (3)] in which a thiadiazole ring is not fused. The obtained results are shown in FIG. 3.

Figure 3:
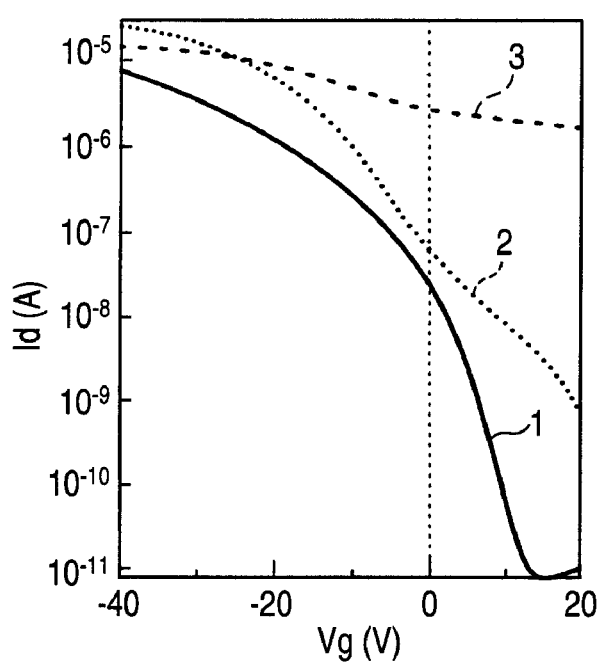
FIG. 3 is a graph to show a Vg-Id characteristic of an organic thin film transistor including, as a channel layer, a semiconductor thin film made of a TTF derivative ($C_3$MDT-TDz-TTF) of a structural formula (1) according to an embodiment of the invention and comparative examples.
Figure 3:
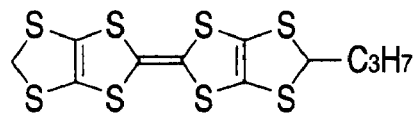
Figure 3:
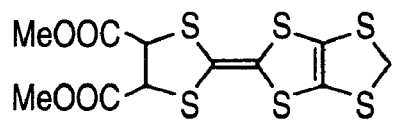
Figure 3:
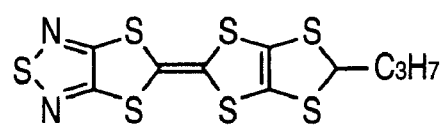

As is clear from FIG. 3, it has been confirmed that the organic thin film transistor using the TTF derivative [structural formula (1)] in which a thiadiazole ring is fused according to an embodiment of the invention exhibits a very large ON/OFF ratio (from $10^5$ to $10^6$) and has a good channel characteristic as compared with the organic thin film transistors using other TTF derivatives [structural formulae (2) and (3)']. Also, the organic thin film transistor using the TTF derivative [structural formula (1)] in which a thiadiazole ring is fused according to an embodiment of the invention had a carrier mobility of from 0.02 to 0.03 $cm^2/Vs$. From these results, it has been confirmed that the organic semiconductor material according to an embodiment of the invention is stable against the oxidation. Also, the results as shown in FIG. 3 coincide with the previously shown calculation results of ionization potential (IP).

Figure 4:
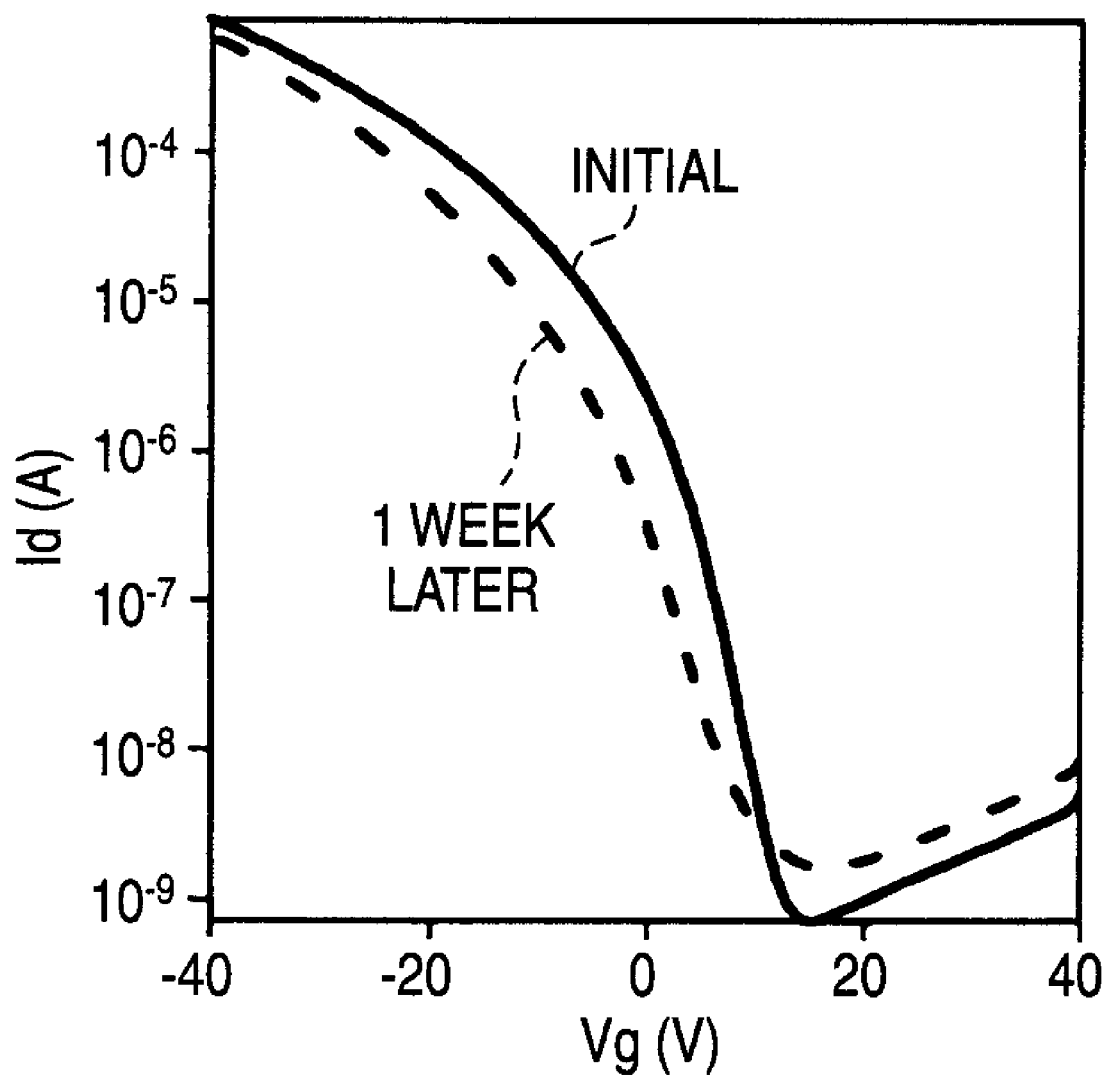
FIG. 4 is a graph to show a Vg-Id characteristic regarding an organic thin film transistor including, as a channel layer, a semiconductor thin film made of a TTF derivative ($C_3$MDT-TDz-TTF) of a structural formula (1) according to an embodiment of the invention before and after standing for one week.

4) Device Characteristic-2:

After standing an organic thin film transistor using, as a channel layer, a semiconductor thin film made of the TTF derivative ($C_3$MDT-TDz-TTF) represented by the foregoing structural formula (1) in the atmosphere for one week, a gate voltage (Vg)-drain current (Ig) characteristic was measured. In FIG. 4, a value before standing is shown as "Initial" along with a value after standing for one week as "1 week later".

As is clear from FIG. 4, it has been confirmed that in the organic thin film transistor using, as a channel layer, a semiconductor thin film made of the TTF derivative ($C_3$MDT-TDz-TTF) represented by the structural formula (1), even after standing in the atmosphere for one week, a carrier mobility and an ON/OFF ratio are kept substantially the same as those before standing. From these results, it has been confirmed that the organic semiconductor material according to an embodiment of the invention is stable against the oxidation due to the atmosphere.

It should be understood by those skilled in the art that various modifications, combinations, sub-combinations and alternations may occur depending on design requirements and other factors insofar as they are within the scope of the appended claims or the equivalents thereof.

What is claimed is:

1. A semiconductor device, including a source and a drain region, comprising an organic semiconductor material represented by the following general formula (1):

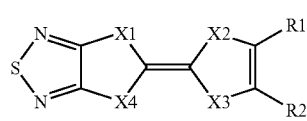

(1)

wherein,
X1 to X4 each independently represent a chalcogen atom,
R1 is $C_nH_{2n+1}$,
R2 is $C_mH_{2m+1}$,
n is an integer of 1 or more, m is an integer of 0 or more, and
a channel layer is configured between the source and the drain by using the organic semiconductor material.

2. The semiconductor device according to claim 1, wherein a semiconductor thin film made of the organic semiconductor material is provided therein, and a carrier is moved in a direction along a thin film surface in the semiconductor thin film.

3. The semiconductor device according to claim 1, wherein in the general formula (1), X1 to X4 each represents sulfur (S).

4. A semiconductor device including a source and drain region, comprising an organic semiconductor material represented by the following general formula (1):

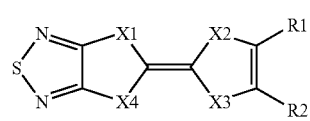

(1)

wherein,
X1 to X4 each independent represent a chalcogen atom, and
in the general formula (1) each of R1 and R2 is an alkylmethylenedithio group, an alkylethylendithio group, an alkylpropylendithio group, or an alkylpyrrole group.

5. The semiconductor device according to claim 4, wherein R1 and R2 form a ring.

* * * * *

UNITED STATES PATENT AND TRADEMARK OFFICE
CERTIFICATE OF CORRECTION

| | |
|---|---|
| PATENT NO. | : 7,763,884 B2 |
| APPLICATION NO. | : 11/769381 |
| DATED | : July 27, 2010 |
| INVENTOR(S) | : Mao Katsuhara and Akito Ugawa |

It is certified that error appears in the above-identified patent and that said Letters Patent is hereby corrected as shown below:

Title page, Item

"(75) Inventors: Mao Tatsuhara, Kanagawa (JP); Akito Ugawa, Kanagawa (JP)"

should be

--(75) Inventors: Mao Katsuhara, Kanagawa (JP); Akito Ugawa, Kanagawa (JP)--

Signed and Sealed this

Nineteenth Day of October, 2010

David J. Kappos
*Director of the United States Patent and Trademark Office*